(12) United States Patent
Lee et al.

(10) Patent No.: US 10,554,194 B2
(45) Date of Patent: *Feb. 4, 2020

(54) BULK ACOUSTIC RESONATOR AND FILTER

(71) Applicant: SAMSUNG ELECTRO-MECHANICS CO., LTD., Suwon-si (KR)

(72) Inventors: Tae Kyung Lee, Suwon-si (KR); In Young Kang, Suwon-si (KR); Ran Hee Shin, Suwon-si (KR); Jin Suk Son, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/224,025

(22) Filed: Dec. 18, 2018

(65) Prior Publication Data

US 2019/0149127 A1 May 16, 2019

Related U.S. Application Data

(63) Continuation of application No. 15/392,068, filed on Dec. 28, 2016, now Pat. No. 10,193,526.

(30) Foreign Application Priority Data

Aug. 3, 2016 (KR) ........................ 10-2016-0098697

(51) Int. Cl.
*H03H 9/17* (2006.01)
*H03H 9/54* (2006.01)
(Continued)

(52) U.S. Cl.
CPC .............. *H03H 9/171* (2013.01); *H03H 3/02* (2013.01); *H03H 9/02015* (2013.01); *H03H 9/173* (2013.01); *H03H 9/54* (2013.01)

(58) Field of Classification Search
CPC . H03H 3/02; H03H 9/56; H03H 9/171; H01L 41/18
(Continued)

(56) References Cited

U.S. PATENT DOCUMENTS 7,482,737 B2 1/2009 Yamada et al.
9,160,298 B2 10/2015 Yokoyama
(Continued)

FOREIGN PATENT DOCUMENTS

JP 2007-181185 A 7/2007
JP 2016-502363 A 1/2016
(Continued)

OTHER PUBLICATIONS

Lee, Si-Hyung, et al., "Growth of highly c-axis textured AlN films on Mo electrodes for film bulk acoustic wave resonators", *Journal of Vacuum Science & Technology*, 2003, pp. 1-5, vol. 21, Issue 1 (5 pages in English).
(Continued)

*Primary Examiner* — Dean O Takaoka
(74) *Attorney, Agent, or Firm* — NSIP Law

(57) ABSTRACT

A bulk acoustic resonator includes a substrate, a first electrode disposed above the substrate, a piezoelectric body disposed on the first electrode and including a plurality of piezoelectric layers each including aluminum nitride with a doping material, and a second electrode disposed on the piezoelectric body, where at least one of the piezoelectric layers is a compressive piezoelectric layer formed under compressive stress.

14 Claims, 20 Drawing Sheets

(51) Int. Cl.
*H03H 3/02* (2006.01)
*H03H 9/02* (2006.01)

(58) Field of Classification Search
USPC .................................................. 333/187, 191
See application file for complete search history.

(56) References Cited

U.S. PATENT DOCUMENTS

| | | | |
|---|---|---|---|
| 10,193,526 B2* | 1/2019 | Lee | ............... H03H 3/02 |
| 2005/0237132 A1 | 10/2005 | Sano et al. | |
| 2009/0246385 A1 | 10/2009 | Felmetsger et al. | |
| 2010/0148637 A1 | 6/2010 | Satou | |
| 2011/0180391 A1 | 7/2011 | Larson, III et al. | |
| 2012/0133246 A1 | 5/2012 | Yaoi et al. | |
| 2013/0049544 A1 | 2/2013 | Yokoyama | |
| 2014/0125203 A1 | 5/2014 | Choy et al. | |
| 2014/0167560 A1 | 6/2014 | Onda | |
| 2014/0354109 A1 | 12/2014 | Grannen et al. | |

FOREIGN PATENT DOCUMENTS

| | | |
|---|---|---|
| KR | 10-2013-0021319 A | 3/2013 |
| KR | 10-1386754 B1 | 4/2014 |
| WO | WO 2011/018913 A1 | 2/2011 |
| WO | WO 2014/094883 A1 | 6/2014 |

OTHER PUBLICATIONS

Stan, G. E., et al., "Highly Textured (001) AlN Nanostructured Thin Films Synthesized by Reactive Magnetron Sputtering for SAW and FBAR Applications", *Digest Journal of Nanomaterials and Biostructures*, 2010, vol. 5, No. 4, pp. 1041-1054 (14 pages in English).

Tanner, S. M., et al., "Microstructure and chemical wet etching characteristics of AlN films deposited by ac reactive magnetron sputtering", *Journal of Vacuum Science & Technology*, 2010, vol. 28, Issue 69, pp. 69-76 (9 pages in English).

Felmetsger, V.V., et al., "Reactive Sputtering of Highly C-Axis Textured Ti-Doped AlN Thin Films", *IEEE International Ultrasonics Symposium Proceedings*, 2012, pp. 782-785 (4 pages in English).

IMOA, "Molybdenum properties", IMOA, 2018 (1 page in English).

Korean Office Action dated Jun. 27, 2019 in counterpart Korean Patent Application No. 10-2016-0098697 (5 pages in English and 5 pages in Korean).

* cited by examiner

BULK ACOUSTIC RESONATOR AND FILTER

CROSS-REFERENCE TO RELATED APPLICATION

This application is a continuation of application Ser. No. 15/392,068 filed on Dec. 28, 2016, which claims benefit of priority to Korean Patent Application No. 10-2016-0098697 filed on Aug. 3, 2016 in the Korean Intellectual Property Office, the disclosure of which is incorporated herein by reference in its entirety and for all purposes.

BACKGROUND

1. Field

The present disclosure relates to a bulk acoustic resonator and filter.

2. Description of Related Art

With development of mobile communications devices, chemical and biological devices, and the like, there may be a desire for small, light filters, oscillators, resonant elements, acoustic resonant mass sensors, and the like, for such devices.

Film bulk acoustic resonators (FBARs) have been used to implement such small, light filters, oscillators, resonant elements, acoustic resonant mass sensors, and the like.

Such an FBAR may be mass-produced at reduced costs, and may be implemented with a subminiature size. In addition, such an FBAR may provide a high quality (Q) factor value, an important characteristic of a filter, and may even be used in a microwave frequency band and/or for implementing particular bands of a personal communications system (PCS) and a digital cordless system (DCS).

In general, an FBAR may include a resonant part or portion, i.e., a resonant unit, implemented by a sequentially stacked first electrode, piezoelectric body, and second electrode on a substrate.

When electrical energy is applied to the first and second electrodes to induce an electric field in the piezoelectric layer, the electric field may generate a piezoelectric phenomenon in the piezoelectric layer to allow the resonant part to vibrate in a predetermined direction. Resultantly, bulk acoustic waves may be generated in the same direction as the direction in which the resonant part vibrates, thereby generating resonance.

With FBARs, using bulk acoustic waves (BAW), if an effective electromechanical coupling coefficient ($K_t^2$) of the piezoelectric body is increased, frequency characteristics of an acoustic wave element may be improved and a widening of a band possible. Here, the electromechanical coupling coefficient $K_t^2$ may represent a ratio of mechanical energy out to electrical energy in to the acoustic resonator.

SUMMARY

This Summary is provided to introduce a selection of concepts in a simplified form that are further described below in the Detailed Description. This Summary is not intended to identify key features or essential features of the claimed subject matter, nor is the Summary intended to be used as an aid in determining the scope of the claimed subject matter.

According to an aspect of the present disclosure, a bulk acoustic resonator includes a substrate, a first electrode disposed above the substrate, a piezoelectric body disposed on the first electrode and including a plurality of piezoelectric layers each including aluminum nitride with a doping material, and a second electrode disposed on the piezoelectric body, where at least one of the piezoelectric layers is a compressive piezoelectric layer formed under compressive stress.

The bulk acoustic resonator may further include an air cavity formed between the first electrode and the substrate.

The doping material may include one selected from the group consisting of scandium, erbium, yttrium, lanthanum, titanium, zirconium, and hafnium, or a combination thereof.

The content of the doping material included in each of the plurality of piezoelectric layers may be 1 at % to 20 at %.

The compressive piezoelectric layer of the plurality of piezoelectric layers may have a c-axis lattice constant greater than respective c-axis lattice constants of remaining piezoelectric layers of the plurality of piezoelectric layers.

The compressive piezoelectric layer may be formed under compressive stress such that a ratio (c/a) of a lattice constant of the compressive piezoelectric layer in a c-axis direction to a lattice constant of the compressive piezoelectric layer in an a-axis direction is higher in the compressive piezoelectric layer than a ratio (c/a) of a lattice constant of another piezoelectric layer, of the plurality of piezoelectric layers and formed in a state in which compressive stress is not applied, in a c-axis direction to a lattice constant of the other piezoelectric layer in an a-axis direction.

The compressive piezoelectric layer may be disposed in a portion of the piezoelectric body so as to directly contact the first electrode.

A density of the compressive piezoelectric layer may exceed 3.4681 g/cm3.

Another piezoelectric layer of the plurality of piezoelectric layers may be formed on the compressive piezoelectric layer, and may be formed to have a lesser number of abnormal growths generated per unit area than if the other piezoelectric layer were formed on another aluminum nitride piezoelectric, with a same doping, but under tensile or no applied stress and without presence of the compressive piezoelectric layer.

A refractive index of the compressive piezoelectric layer may exceed 2.1135.

Residual stress of the piezoelectric body may be tensile stress.

The first electrode may be formed under compressive stress, such that a lattice constant of the first electrode in an a-axis direction is higher in the first electrode than if first electrode was formed in a state in which stress was not applied.

The first electrode may be formed of one selected from the group consisting of gold (Au), titanium (Ti), tantalum (Ta), molybdenum (Mo), ruthenium (Ru), platinum (Pt), tungsten (W), aluminum (Al), nickel (Ni), and Iridium (Ir), or alloys thereof.

The first electrode may include molybdenum (Mo) or an alloy thereof, and a lattice constant of the first electrode may have a value larger than 3.12 Å.

According to an aspect of the present disclosure, a filter may include a plurality of film bulk acoustic resonators configured as signal filter, where at least one of the plurality of film bulk acoustic resonators has the bulk acoustic resonator configuration as described herein.

According to an aspect of the present disclosure, a film bulk acoustic resonator includes a substrate, a resonant unit, including: a first electrode disposed above the substrate; a piezoelectric body having at least two piezoelectric layers formed under different applied stresses; and a second electrode disposed on the piezoelectric body, and an air cavity disposed below the resonant unit.

The resonant unit may have a residual tensile stress and the piezoelectric body may have at least one piezoelectric layer formed under compressive stress and at least one immediately adjacent piezoelectric layer formed under tensile stress.

The at least two piezoelectric layers may be each doped aluminum nitride piezoelectric layers, where the doped aluminum nitride piezoelectric layers have hexagonal closest packing (HCP) structures.

A piezoelectric layer of the at least one piezoelectric layer formed under compressive stress may have an HCP structure that is lattice matched to a lattice structure of the first electrode formed under compressive stress.

The first electrode may be formed under compressive stress and have body centered cubic lattice (BCC) structure.

A piezoelectric layer of the piezoelectric body may be formed under compressive stress to have an HCP structure that is lattice matched to a lattice structure of the first electrode formed under compressive stress.

According to an aspect of the present disclosure, a bulk acoustic resonator method includes forming a first electrode under applied compressive stress, forming a piezoelectric body disposed on the first electrode and including at least two piezoelectric layers formed under different applied stresses, including a piezoelectric layer formed under applied compressive stress, and forming a second electrode disposed on the piezoelectric body, where a resonant unit formed by the first electrode, the piezoelectric body, and the second electrode has a residual tensile stress.

The forming of the piezoelectric body may include forming the piezoelectric layer formed under compressive stress so as to have an HCP structure that is lattice matched to a lattice structure of the first electrode having a different lattice structure.

The forming of the piezoelectric body may include forming the piezoelectric body under a net tensile applied stress.

The forming of the piezoelectric body may include forming the at least two piezoelectric layers to each be aluminum nitride piezoelectric layers with respective dopants, where each of the doped aluminum nitride piezoelectric layers have hexagonal closest packing (HCP) structures, where the first electrode may have a body centered cubic lattice (BCC) structure.

Other features and aspects will be apparent from the following detailed description, the drawings, and the claims.

BRIEF DESCRIPTION OF DRAWINGS

The above and other aspects, features, and advantages of the present disclosure will be more clearly understood from the following detailed description taken in conjunction with the accompanying drawings, in which.

Throughout the drawings and the detailed description, the same reference numerals refer to the same or like elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Figure 1:
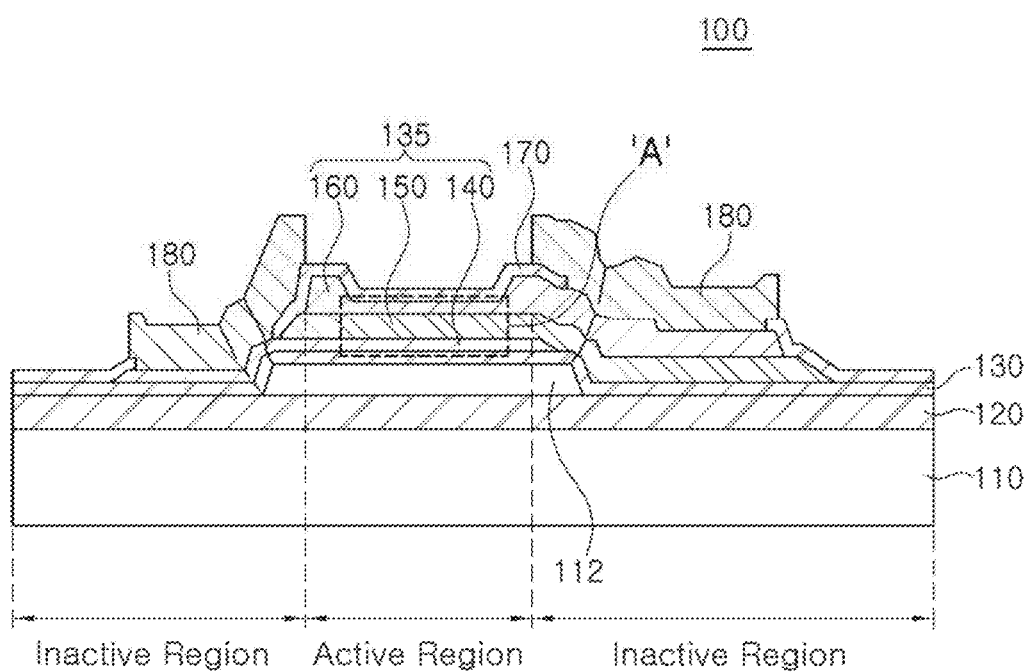
FIG. 1 is a cross-sectional view schematically illustrating a film bulk acoustic resonator according to one or more embodiments.

FIG. 1 is a cross-sectional view schematically illustrating a film bulk acoustic resonator according to one or more embodiments.

Referring to FIG. 1, an acoustic resonator 100, according to one or more embodiments, may be a film bulk acoustic resonator (FBAR), and may include a substrate 110, an insulating layer 120, an air cavity 112, and a resonant part 135.

The substrate 110 may be a silicon substrate, as only an example, and the insulating layer 120 may be provided on an upper surface of the substrate 110 to electrically isolate the substrate 110 and the resonant part 135 from each other.

The insulating layer 120 may be manufactured by forming at least one of silicon dioxide ($SiO_2$), silicon nitride ($Si_3N_4$), aluminum oxide ($Al_2O_3$), and aluminum nitride (AlN), as only examples, on the substrate 110 by one of a chemical vapor deposition process, an RF magnetron sputtering process, and an evaporation process, as only examples.

The air cavity 112 may be formed on the substrate 110. The air cavity 112 may be positioned below the resonant part 135 and may operate as an impedance to prevent leakage of acoustic waves generated by the resonant part 135, where the resonant part 135 may vibrate in a predetermined direction upon excitation of electrodes of the resonant part 135. During manufacture of the acoustic resonator 100, the air cavity 112 may be formed by first forming an air cavity sacrificial layer pattern on the insulating layer 120, then forming a membrane 130 over the air cavity sacrificial layer pattern, and subsequent etching and removing of the air cavity sacrificial layer pattern beneath the membrane 130 through an etching process. The membrane 130 may also serve as an oxidation protection film, or may serve as a protection layer protecting the substrate 110.

In an embodiment, the acoustic resonator 100 further includes a seed layer of aluminum nitride (AlN) formed on the membrane 130, e.g., disposed between the membrane 130 and a first electrode 140 of the resonant part 135.

In addition, in an embodiment, an etch stop layer is additionally formed on the insulating layer 120 before forming of the air cavity sacrificial layer pattern. Here, the etch stop layer may protect the substrate 110 and the insulating layer 120 from the etching process that may be implemented to remove the sacrificial layer pattern when forming the air cavity 112, and may also serve as a base for depositing several other layers on the etch stop layer.

The resonant part 135 may include the first electrode 140, a piezoelectric body 150, and a second electrode 160. The first electrode 140, the piezoelectric body 150, and the second electrode 160 may be sequentially stacked.

The first electrode 140 may extend from an upper portion of one region above the insulating layer 120 on the membrane 130 and over the air cavity 112, the piezoelectric body 150 may be formed on the first electrode 140 over the air cavity 112, and the second electrode 160 may extend from an upper portion of another region above the insulating layer 120 on the piezoelectric body 150 and over the air cavity 112. Thus, there may be a common region of the first electrode 140, the piezoelectric body 150, and the second electrode 160 where the first electrode 140, the piezoelectric body 150, and the second electrode 160 overlap in a vertical direction above the air cavity 112.

The piezoelectric body 150, which generates a piezoelectric effect of converting electric energy into mechanical energy having an acoustic wave form, may include one or more piezoelectric layers including aluminum nitride (AlN) to which a doping material is added, for example. The doping material may be a rare earth metal, for example, which may include, as only examples, at least one selected from the group consisting of scandium (Sc), erbium (Er), yttrium (Y), and lanthanum (La). Alternatively, the doping material may be at least one selected from the group consisting of titanium (Ti), zirconium (Zr), and hafnium (Hf), as only examples. The content of the doping material included in the piezoelectric layer may be 1 at % (atomic percentage) to 20 at %, for example.

The resonant part 135 may be understood to have an active region and inactive regions. The active region of the resonant part 135 vibrates and resonates in a predetermined direction by a piezoelectric phenomenon generated in the piezoelectric body 150 when electric energy, such as a radio frequency signal, is applied to the first electrode 140 and the second electrode 160. The resonant part 135 may correspond to a region in which the first electrode 140, the piezoelectric body 150, and the second electrode 160 overlap with one another in the vertical direction above the air cavity 112. The active region may be confined to the resonant part 135, e.g., with the air cavity 112 providing impedance to leakage of acoustic energy from the resonant part 135. Thus, the inactive regions of the resonant part 135 are regions that do not resonate by the piezoelectric phenomenon even through the electric energy is applied to the first and second electrodes 140 and 160, and correspond to regions of the resonant part 135 and acoustic resonator 100 outside the active region.

Through use of the piezoelectric phenomenon, the resonant part 135 can be used to selectively transmute, e.g., pass or output, radio frequency signals having a specific frequency. In detail, the resonant part 135 may pass or output input radio frequency signals based on their correspondence to a resonant frequency corresponding to the vibrations of the resonant part 135 that are dependent on the particular piezoelectric phenomenon of the piezoelectric body 150, such as depending on the thickness of the piezoelectric body 150.

A protection layer 170 may be disposed on the second electrode 160 of the resonant part 135 to prevent the second electrode 160 from being externally exposed and oxidized, and an electrode pad 180 for applying electrical signals may be formed on each of the first electrode 140 and the second electrode 160. The electrode pads 180 may be externally exposed for external connections, for example.

Figure 2:
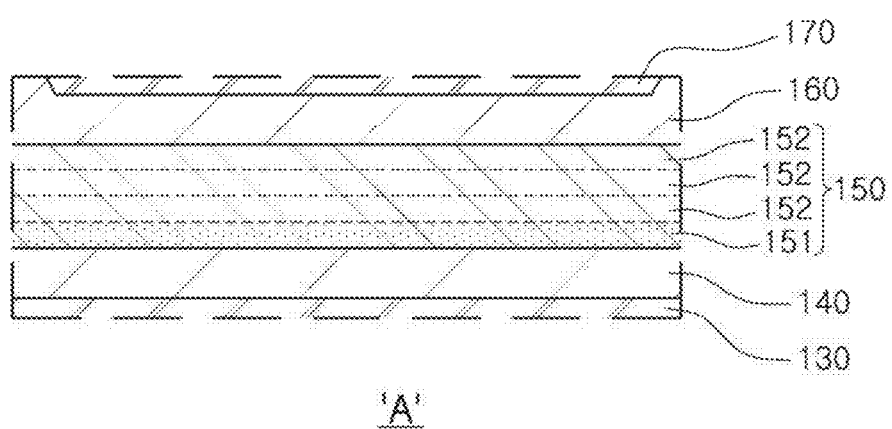
FIG. 2 is an example schematic enlarged view of part A of FIG. 1 showing an example of the resonant part of FIG. 1.

FIG. 2 is an example schematic enlarged view of part A of FIG. 1 showing an example of the resonant part 135.

Referring to FIG. 2, the resonant part 135 of a film bulk acoustic resonator, according to one or more embodiments, may have a structure in which the first electrode 140, the piezoelectric body 150, and the second electrode 160 are stacked.

Figure 20:
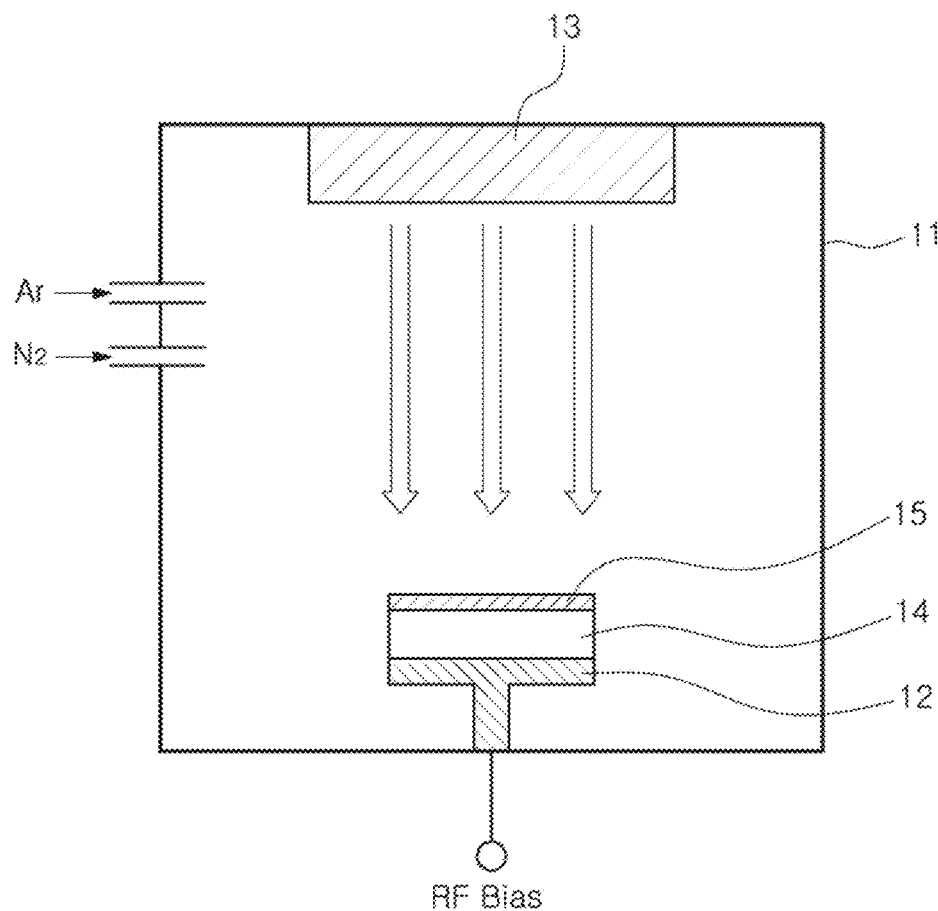
FIG. 20 is a view illustrating a sputtering apparatus and sputtering process for growing a piezoelectric body and an electrode, according to one or more embodiments.
Figure 21:
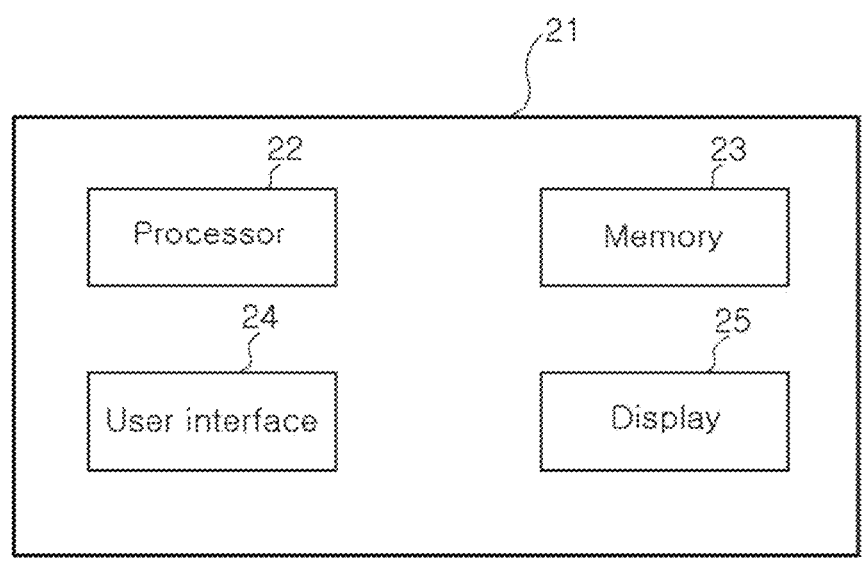
FIG. 21 illustrates an example controller for a sputtering process, according to one or more embodiments.

The first electrode 140, the piezoelectric body 150, and the second electrode 160 may be formed using a sputtering apparatus, such as that illustrated in FIG. 20, as only an example. FIG. 20 illustrates a sputtering apparatus and sputtering process according to one or more embodiments. FIG. 21 also illustrates an example controller 21 for a sputtering process, such as the sputtering process of FIG. 20. The controller 21 of FIG. 21 may also control the sputtering apparatus of FIG. 20, depending on embodiment. Though the below includes explanations of processes for forming a piezoelectric layer, a piezoelectric body with multiple layers, and/or an electrode for which the piezoelectric body is configured to contact, embodiments are not limited to the same or to a particular layer forming apparatus or process, such as the example sputtering apparatus and process of FIG. 20.

Referring to the example of FIG. 20, the example sputtering apparatus may include a chamber 11, a support member 12, and a target 13. A basic member 14 being a base of a material to be grown may be disposed on the support member 12, and as a sputtering process is performed, the material to be grown may be deposited on the basic member 14, such that a forming layer 15 may be grown. Argon (Ar) and nitrogen ($N_2$) may be injected into the chamber 11 to adjust an atmosphere in the chamber 11 in a process of growing the first electrode 140, the piezoelectric body 150, and the second electrode 160, for example.

The support member 12 may be connected to a radio frequency (RF) bias power part to adjust stresses of the material being grown in the respective processes of growing the first electrode 140, the piezoelectric body 150, and the second electrode 160. For example, depending on the RF bias power, the stresses to be different compressive stresses or tensile stresses. The controller 21 of FIG. 21 may include the RF bias power part, such as included in the processor 22. The controller 21 of FIG. 21 may further include a memory 23, a user interface 24, and display 25, where the processor 22 may be configured to control the sputtering apparatus to perform any or any combination of the sputtering process described herein. In addition, the memory 23 may further be a non-transitory computer-readable storage medium storing instructions that, when executed by the processor 22, as only an example, causes such a sputtering apparatus or other layer forming apparatus to perform any or any combination of the processes described herein.

Returning to FIG. 2, the first electrode 140 may be grown using molybdenum (Mo) as the target 13. However, the first electrode 140 is not limited to being formed of molybdenum, but may be formed of one selected from the group consisting of gold (Au), titanium (Ti), tantalum (Ta), molybdenum (Mo), ruthenium (Ru), platinum (Pt), tungsten (W), aluminum (Al), nickel (Ni), and Iridium (Ir), or alloys thereof, as only examples. In this case, stress of the grown first electrode 140 may be adjusted, such as by the controller 21 and/or control of the RF bias power of the sputtering apparatus of FIG. 20, to be compressive stress to improve crystal orientation, for example. Hereinafter, explanations with respect to adjustments of stresses during a sputtering process, for example, or other operations regarding operations of the sputtering apparatus or differing sputtering processes, should be understood as also being available to be performed through operation and control of the controller 21. Alternatively, or additionally, such operation controls may be implemented by user interaction with the user interface of the controller 21, such as based on information or prompts by the display 25.

Thus, after the first electrode 140 is formed, the piezoelectric body 150 may be caused to be formed on the first electrode 140.

Figure 3:
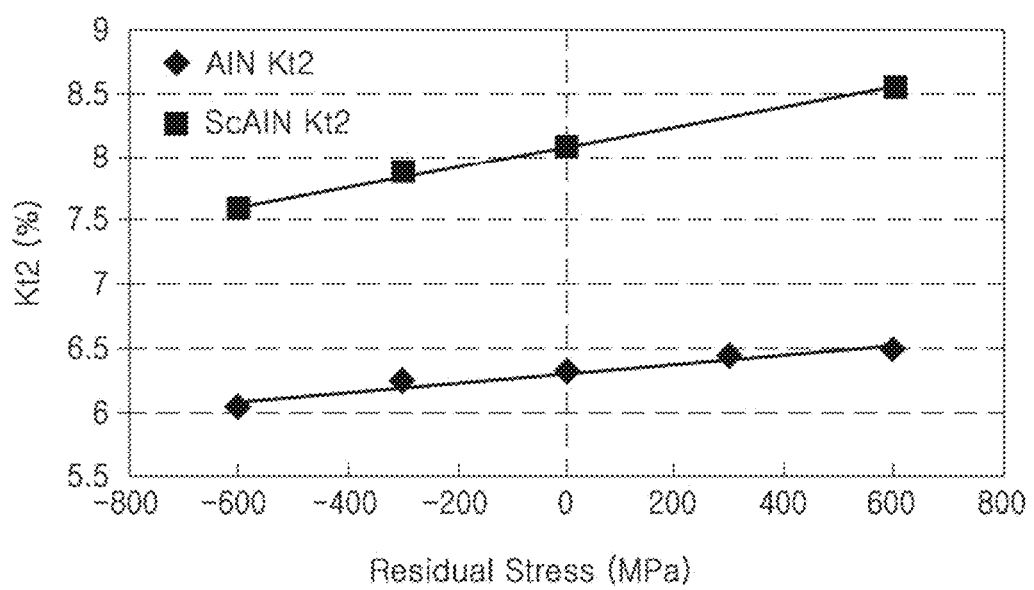
FIG. 3 illustrates graphs showing changes in effective electromechanical coupling coefficient ($K_t^2$) values for two example film bulk acoustic resonators for different residual stresses of their respective piezoelectric bodies.

FIG. 3 illustrates graphs showing changes in effective electromechanical coupling coefficient ($K_t^2$) values for two example film bulk acoustic resonators for different n residual stresses of their respective piezoelectric bodies 150. As shown in FIG. 3, in one or more embodiments, effective electromechanical coupling coefficients ($K_t^2$) of two example piezoelectric bodies 150 may be increased with increases in residual stress. With an increase in $K_t^2$, frequency characteristics of the corresponding acoustic wave element may be improved and a widening of a band possible compared to a lower $K_t^2$. Here, the two example piezoelectric bodies 150 include an example aluminum nitride (AlN) piezoelectric body 150 and an example aluminum nitride doped with scandium (ScAlN) piezoelectric body 150.

It may be appreciated from FIG. 3 that as residual stress of each piezoelectric body 150 gradually becomes large, from the example −600 MPa (a compressive stress) to example 600 MPa (a tensile stress), the effective electromechanical coupling coefficient ($K_t^2$) of the piezoelectric body 150 is increased in proportion to the residual stress of the piezoelectric body 150. In addition, it may be confirmed that the effective electromechanical coupling coefficient ($K_t^2$) of the piezoelectric body 150 is higher in a case of the ScAlN piezoelectric body 150 than in a case of using the AlN piezoelectric body 150. Here, the example doping material is scandium, but embodiments are not limited thereto.

Figure 4:
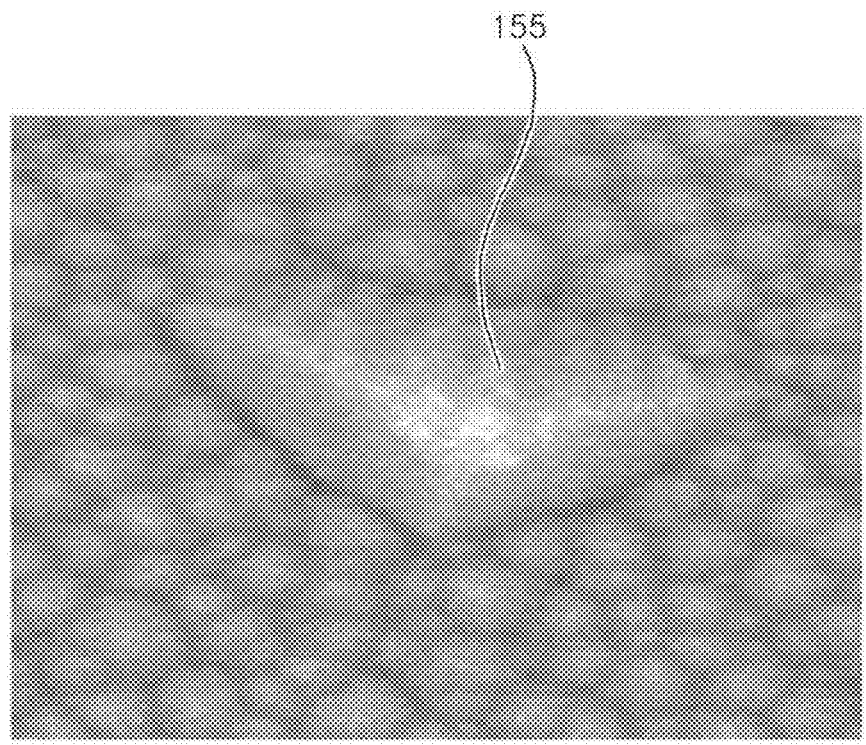
FIG. 4 is an image of abnormal growth generated in aluminum nitride doped with scandium, observed using a scanning electron microscope (SEM)

However, in a case in which the piezoelectric body including the aluminum nitride to which the doping material is added is formed so that the residual stress thereof becomes tensile stress, there may be a problem in that the number of abnormal growths generated in the piezoelectric body 150 is increased, such as illustrated in FIG. 4, which is an image of an abnormal growth 155 generated in aluminum nitride doped with scandium, observed using a scanning electron microscope (SEM).

These abnormal growths may be mainly generated in a position at which surface energy may be lowered at the time of crystal growth, and as the number of abnormal growths 155 generated in the piezoelectric body 150 is increased, there may be loss of acoustic waves in a longitudinal direction and an increase in acoustic waves in a transversal direction in the film bulk acoustic resonator. The increased transversal direction acoustic waves may result in increased noise, and the loss of acoustic waves in the longitudinal direction may result in a lower quality factor.

Therefore, it may be desirable for the piezoelectric body 150 to be formed of the aluminum nitride to which the doping material is added in a manner to prevent the abnormal growths while also maintaining overall residual stress of the piezoelectric body 150 as tensile stress for the increased $K_t^2$.

In a film bulk acoustic resonator according to one or more embodiments, at least one of a plurality of piezoelectric layers 151 and 152 making up the piezoelectric body 150 may be formed under compressive stress in a process of forming the piezoelectric body 150 using the aluminum nitride to which the doping material is added, so that the generation of the abnormal growths in the piezoelectric body 150 may be prevented or minimized and so that the piezoelectric body 150 may have a high $K_t^2$.

As described above, at least one piezoelectric layer formed under compressive stress among the plurality of piezoelectric layers making up the piezoelectric body 150 in the process of forming the piezoelectric body may be a piezoelectric layer formed under compression, referred to hereinafter as a compressive piezoelectric layer.

As described in more detail below, in one or more embodiments, a ratio of a lattice constant of such a compressive piezoelectric layer in a c-axis direction to a lattice constant of the compressive piezoelectric layer in an a-axis direction may be higher than a ratio of a lattice constant of a non-compressive piezoelectric layer, i.e., a piezoelectric formed not under compression, in a c-axis direction to a lattice constant of the non-compressive piezoelectric layer, such as where a density of the compressive piezoelectric layer may exceed 3.4681 g/cm³ and a refractive index of the compressive piezoelectric layer may exceed 2.1135, as only examples. In addition, the compressive piezoelectric layer has a c-axis lattice constant greater than those of other non-compressive piezoelectric layers.

In addition, in one or more embodiments, the compressive piezoelectric layer may be disposed in a lower portion of the piezoelectric body 150 so as to contact the first electrode 140, which may decrease or prevent, e.g., significantly decrease or prevent, generation of abnormal growths in the process of forming the compressive piezoelectric layer and any remaining piezoelectric layers of the piezoelectric body 150 using the aluminum nitride to which the doping material is added.

After the piezoelectric body 150 is formed, the second electrode 160 may be formed on the piezoelectric body 150, such as by the aforementioned control of the sputtering apparatus of FIG. 20.

The second electrode 160 may be disposed to face the first electrode 140 with the piezoelectric body 150 interposed therebetween.

The second electrode 160 may be formed of molybdenum, similar to the first electrode 140, but is not limited thereto. For example, the second electrode 160 may be formed of one selected from the group consisting of, for example, gold (Au), titanium (Ti), tantalum (Ta), molybdenum (Mo), ruthenium (Ru), platinum (Pt), tungsten (W), aluminum (Al), nickel (Ni), and Iridium (Ir), or alloys thereof, as only examples.

One or more embodiments include forming the resonant part 135, including the first electrode 140, plural piezoelectric layers formed under at least two different compression conditions, and a second electrode 160, in combination with the remaining layers of the acoustic resonator of FIG. 1, to form an acoustic resonator according to one or more embodiments. In one or more embodiments, at least the first electrode 140 and an immediately adjacent piezoelectric layer of the plural piezoelectric layers are formed under compression and at least one other layer of the plural piezoelectric layers is formed under zero or tensile stress. In addition, in one or more embodiments, a residual stress of the resonant part formed with the first electrode 140, the plural piezoelectric layers, and the second electrode 160 is a tensile stress.

Hereinafter, embodiments will be described in more detail through experimental and comparative examples. However, such examples are only provided to assist in gaining a detailed understanding of the present disclosure, and the scope of the present disclosure is not limited by the such experimental examples, for example.

As illustrated in the below Table 1, a process of forming a piezoelectric body was divided into processes of forming four example piezoelectric layers. However, the number of piezoelectric layers or such division of processes is not limited thereto.

Such below experimental examples of respective piezoelectric layer formations were obtained by implementing methods of growing piezoelectric layers in respective states in which compressive stress or tensile stress were applied to the corresponding piezoelectric layers or one or more of the electrodes of a corresponding resonant part according to one or more embodiments, such as by adjusting RF bias power applied to the support member of the example sputtering apparatus of FIG. 20 where the corresponding crystalline structures were grown.

In Table 1, piezoelectric body Samples #1-1, #1-2, #1-3, #1-4, #1-5, and #1-6 were grown on a silicon wafer.

TABLE 1

|  | #1-1 | #1-2 | #1-3 | #1-4 | #1-5 | #1-6 |
|---|---|---|---|---|---|---|
| Fourth Layer | ◇ | ■ | ■ | ■ | ◆ | □ |
| Third Layer | ◇ | ■ | ■ | ◆ | ■ | □ |
| Second Layer | ◇ | ■ | ◆ | ■ | ■ | □ |
| First Layer | ◇ | ◆ | ■ | ■ | ■ | □ |
| Target Residual Stress (MPa) of Piezoelectric Body | −300 | 300 | 300 | 300 | 300 | 300 |

The first to fourth piezoelectric layers of the respective piezoelectric bodies in Table 1 were sequentially defined in a stacking direction from the first piezoelectric layer among the plurality of piezoelectric layers making up the piezoelectric body.

The "Target Residual Stress of Piezoelectric Body" means the overall residual stress of the respective piezoelectric body after the piezoelectric body is formed.

In addition, as a legend to Table 1, the below Table 2 indicates the respective growing conditions ◇, ◆, □, and ■ referred to in Table 1 for each grown layer. In Table 2, the RF bias is a bias applied to the support member in the sputtering apparatus of FIG. 20, and the stress means stress applied to the corresponding piezoelectric layer grown depending on the RF bias.

TABLE 2

|  | RF Bias (W) | Stress (MPa) |
|---|---|---|
| ■ | 68.75 | 600 |
| □ | 82.25 | 300 |
| ○ | 95.75 | 0 |
| ◇ | 109.25 | −300 |
| ◆ | 122.75 | −600 |

For example, with the piezoelectric body Sample #1-1, all piezoelectric layers of the resultant piezoelectric body were formed with an RF bias of 109.25 and were under −300

MPa, i.e., compressive stress, which resulted in a residual compressive stress for the piezoelectric body. Rather, with the piezoelectric body Sample #1-2, the second through fourth piezoelectric layers of the resultant piezoelectric body were formed with an RF bias of 68.75 and were under +600 MPa, i.e., tensile stress, after the first piezoelectric layer was formed with an RF bias of 122.75 under −600 MPa, which resulted in a residual tensile stress.

Figure 5:
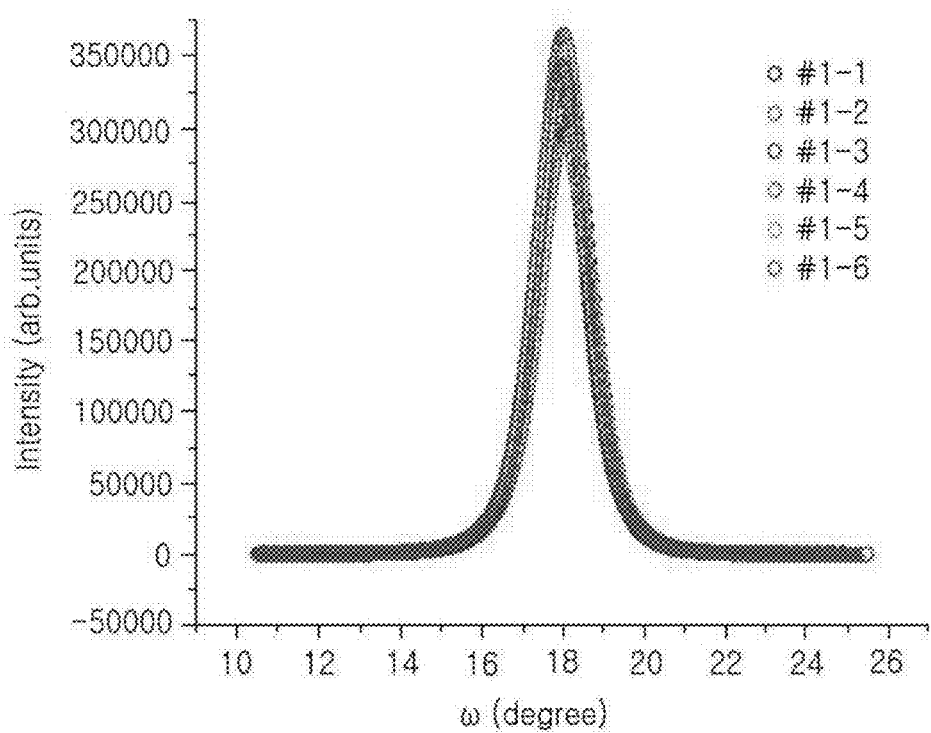
FIG. 5 illustrates graphs showing respective measurement results of X-ray diffraction (XRD) rocking curves for the example samples of Table 1.

FIG. 5 illustrates graphs showing respective measurement results of X-ray diffraction (XRD) rocking curves for the example Samples #1-1, #1-2, #1-3, #1-4, #1-5, and #1-6 of Table 1. Measurement results of the rocking curves for the illustrated respective central values are reproduced with more specificity below in Table 3.

TABLE 3

| Sample No. | FWHM | Central Value | (FWHM/Intensity) × $10^5$ |
| --- | --- | --- | --- |
| #1-1 | 1.50950 | 18.07454 | 0.447 |
| #1-2 | 1.41530 | 18.00245 | 0.380 |
| #1-3 | 1.48765 | 17.93866 | 0.437 |
| #1-4 | 1.50853 | 18.03569 | 0.498 |
| #1-5 | 1.52965 | 18.01024 | 0.430 |
| #1-6 | 1.50006 | 17.97971 | 0.430 |

It may be appreciated from Table 3 that all samples show excellent full widths at half maximum (FWHMs) of about 1.41 to 1.5 to have high crystal orientation.

It may be confirmed that particularly Sample #1-2 has the lowest FWHM to have the highest crystal orientation.

In addition, it may be confirmed that Sample #1-2 shows the lowest FWHM and the highest intensity.

In such a case in which the first layer, that is, the piezoelectric layer disposed to immediately contact the first electrode, of the multiple piezoelectric layers making up the piezoelectric body, is formed as a compressive piezoelectric layer, the piezoelectric body may have the lowest FWHM of the example samples and have the highest crystal orientation of the example samples.

A reason why Sample #1-2 may have such high results of the example samples may be that in a case of densely forming the first (lowest) piezoelectric layer, the first piezoelectric layer becomes a base for starting to form the remaining piezoelectric layers of the piezoelectric body, so an arrangement of the remaining piezoelectric layers grown on the first piezoelectric layer may be improved because of the select approach for forming the first piezoelectric layer of the piezoelectric body.

That is, in a film bulk acoustic resonator according to one or more embodiments, a compressive piezoelectric layer may be disposed or formed at a lower portion of the piezoelectric body, e.g., the lowest piezoelectric layer of the piezoelectric body so as to immediately contact the first electrode, to raise crystal orientation for subsequently formed piezoelectric layers of the piezoelectric body, whereby performance of the film bulk acoustic resonator may be improved over typical film bulk acoustic resonators that do not include piezoelectric bodies with any such selective formation of the piezoelectric body or relationship between the piezoelectric body and the first electrode of the resonant part as described herein.

Figure 6:
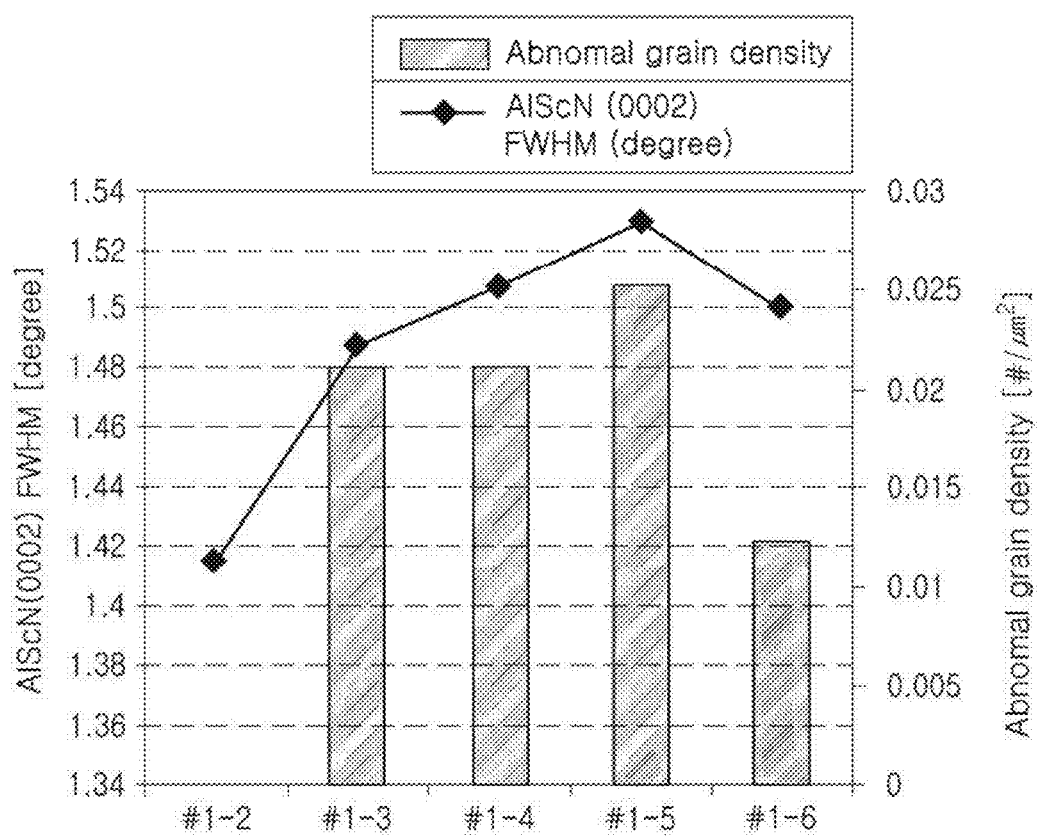
FIG. 6 illustrates two graphs respectively showing measurement results of full widths at half maximum (FWHMs) of XRD rocking curves for the example samples of Table 1 and the corresponding number of abnormal growths generated per unit area.

FIG. 6 illustrates two graphs respectively showing measurement results of FWHMs of XRD rocking curves for the example Samples #1-1, #1-2, #1-3, #1-4, #1-5, and #1-6 of Table 1 and the corresponding number of abnormal growths generated per unit area for each sample, with the measurement results of the FWHMs and the number of abnormal growths being reproduced with more specificity in Table 4.

TABLE 4

|  | #1-1 | #1-2 | #1-3 | #1-4 | #1-5 | #1-6 |
| --- | --- | --- | --- | --- | --- | --- |
| FWHM | 1.5095 | 1.4153 | 1.48765 | 1.50853 | 1.52965 | 1.50006 |
| Number of Abnormal Growths | 0 | 0 | 3.6 | 3.6 | 4.3 | 2.1 |

Here, for the measurement results reproduced in FIG. 6 and Table 4, the number of abnormal growths was measured in an area of 14 μm×12 μm.

It may again be appreciated from FIG. 6 and Table 4 that Sample #1-2, in which the first layer is formed as the compressive piezoelectric layer, has the lowest FWHM and may show the most excellent crystal orientation and least abnormal growths from among Samples #1-1, #1-2, #1-3, #1-4, #1-5, and #1-6.

As described above, at least in the example experimental results in the case of densely forming the first piezoelectric layer, where the lowest piezoelectric layer becomes the base, when starting to form the piezoelectric body, the arrangement of the remaining piezoelectric layers grown on the first layer is improved, such as the abnormal growths being significantly decreased.

According to results of FIG. 6 and Table 4, it may be confirmed that at least with the example samples when a deposition condition of a piezoelectric layer initially deposited at the time of forming the piezoelectric body is a compressive stress condition where ion bombarding energy is raised by increasing an output of the RF bias, crystal orientation may be excellent, and abnormal growths may be suppressed, for the first piezoelectric layer and remaining piezoelectric layers of the piezoelectric body even though the overall residual stress of the piezoelectric body is tensile stress.

Therefore, in a film bulk acoustic resonator according to one or more embodiments, an example aluminum nitride doped with the example scandium may be used as a material of the piezoelectric body and the residual stress of a resultant piezoelectric body may be tensile stress, and thus, the film bulk acoustic resonator may have a very high effective electromechanical coupling coefficient $K_t^2$. At the same time, in such a film bulk acoustic resonator, at least one of the plurality of piezoelectric layers making up the piezoelectric body may be formed as a compressive piezoelectric layer to improve the crystal orientation and prevent or minimize the abnormal growths. In an example, the piezoelectric layer immediately contacting the first electrode may be formed as a compressive piezoelectric layer and one or more or all of the remaining piezoelectric layers of the piezoelectric body may be formed under a tensile stress condition to substantially improve the crystal orientation and prevent abnormal growths.

Figure 7:
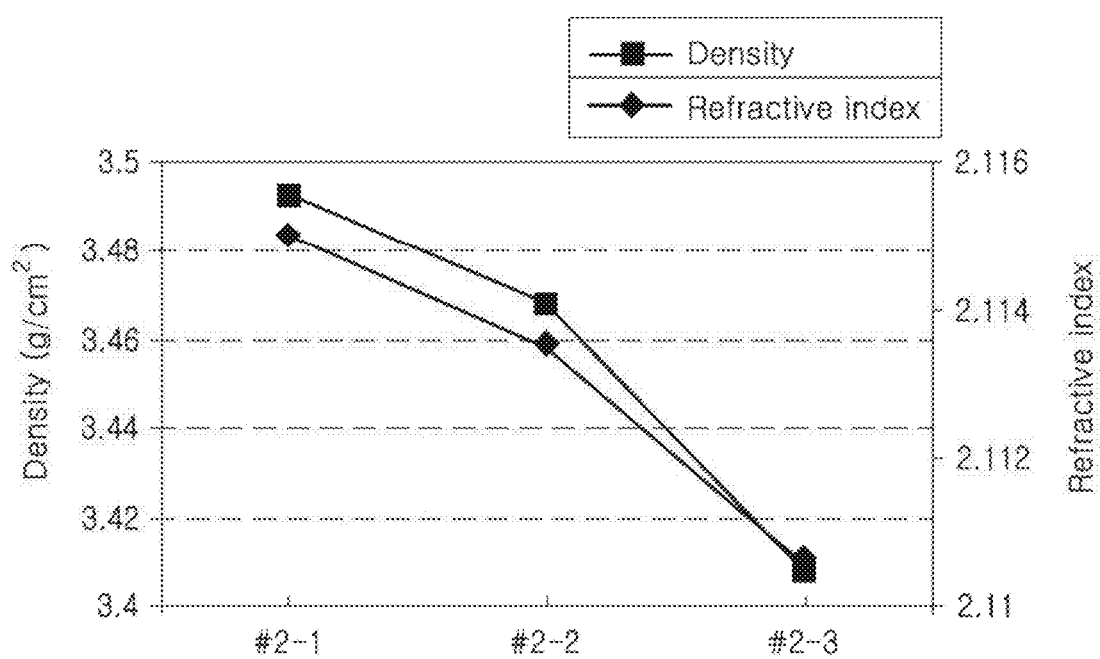
FIG. 7 illustrates two graphs respectively showing measurement results of densities and refractive indices for different applied stresses at the time of growth of a corresponding piezoelectric layer.

FIG. 7 illustrates two graphs respectively showing measurement results of densities and refractive indices for different applied stresses at the time of growth of a corresponding piezoelectric layer, with the below Table 5 reproducing measurement results of FIG. 7 with more specificity.

A compressive piezoelectric layer included in the film bulk acoustic resonator according to one or more embodiments will now be described in more detail with reference to the example Samples #2-1, #2-2, and #2-3 of FIG. 7 and the below Table 5.

TABLE 5

|  | #2-1 | #2-2 | #2-3 |
|---|---|---|---|
| Density (g/cm$^3$) | 3.4925 | 3.4681 | 3.408 |
| Refractive index | 2.115 | 2.1135 | 2.1106 |

Here, Samples #2-1, #2-2, and #2-3 of FIG. 7 and Table 5 are samples in which aluminum nitride doped with scandium is formed under −600 MPa (compressive stress), 0 MPa, and 600 MPa (tensile stress), respectively.

The density for each sample was measured using an X-ray reflectometry (XRR), and the refractive index was measured using an ellipsometer.

It may be appreciated from FIG. 7 and Table 5 that there is a similar tendency between a change in density for different applied pressures and a change in refractive indices for different applied pressures when growing aluminum nitrides, i.e., as the pressure applied during formation of the respective sample piezoelectric layers changes from −600 MPa (compressive stress) to 600 MPa (tensile stress) both densities and refractive indices of the sample piezoelectric layers decrease.

In order to determine a related tendency of a change in a lattice constant of a piezoelectric layer formed under compressive stress, a case in which aluminum nitride is formed under compressive stress will be described.

Aluminum nitride may have a hexagonal closest packing (HCP) structure, a lattice constant of a c-axis of the aluminum nitride may be 4.986 Å, and a lattice constant of an a-axis of the aluminum nitride may be 3.116 Å. That is, a ratio (c/a) of the lattice constant of the c-axis of the aluminum nitride to the a-axis of the aluminum nitride is typically understood to be 1.6.

However, in the case in which aluminum nitride is formed under compressive stress, the ratio (c/a) of the lattice constant of the c-axis of the aluminum nitride to the lattice constant of the a-axis of the aluminum nitride may become higher than 1.6. On the contrary, in a case in which aluminum nitride is formed under tensile stress, the ratio (c/a) of the lattice constant of the c-axis of the aluminum nitride to the lattice constant of the a-axis of the aluminum nitride may be lower than 1.6.

In a crystal structure of aluminum nitride doped with scandium, meaning that some of the aluminum of the aluminum nitride may be replaced by scandium, the lattice constant of the resultant doped aluminum nitride may be different from aluminum nitride that is not doped. However, the crystal structure of the aluminum nitride doped with scandium may still have the HCP structure, and a change in the ratio (c/a) of the lattice constant of the c-axis of the doped aluminum nitride to the lattice constant of the a-axis of the doped aluminum nitride may show similar tendencies with respect to pressure applied to the doped aluminum nitride at the time of forming the doped aluminum nitride. For example, for aluminum nitride doped with scandium formed under compressive stress, the ratio (c/a) of the lattice constant of the c-axis to the lattice constant of the a-axis may be greater than the ratio (c/a) for aluminum nitride doped with scandium formed under 0 MPa, while the ratio (c/a) of the lattice constant of the c-axis to the lattice constant of the a-axis for the aluminum nitride doped with scandium under tensile stress may be lower than the ratio (c/a) for aluminum nitride doped with scandium formed under 0 MPa.

Therefore, in one or more embodiments, a ratio (c/a) of the lattice constant of the compressive piezoelectric layer in the c-axis direction to the lattice constant of the compressive piezoelectric layer in the a-axis direction may be larger than the ratio (c/a) of the corresponding lattice constants of a piezoelectric layer formed in a state in which the stress is not applied.

In addition, as illustrated in FIG. 7 and Table 5, a density of such a compressive piezoelectric layer may exceed 3.4681 g/cm$^3$, and a refractive index of the example compressive piezoelectric layer may exceed 2.1135.

Table 6 below represents additional piezoelectric body Samples #3-0, #3-1, #3-2, #3-3, #3-4, #3-5, and #3-6 demonstrating differing conditions applied to forming the respective piezoelectric layers along with a first electrode of the resonant part of an example acoustic resonator. These experimental results are based on the first electrodes being formed using molybdenum, depending on the indicated conditions for forming the first electrode of Table 6, and the respective piezoelectric bodies each including four piezoelectric layers of aluminum nitride doped with scandium formed on the respective first electrodes.

Each of the piezoelectric bodies were formed on the formed first electrodes, unlike the above Samples #1-1, #1-2, #1-3, #1-4, #1-5, and #1-6 of Table 1, where the piezoelectric bodies were formed on respective silicon wafer bases.

For Table 6, the legend for the indicators ◇, ◆, ☐, and ■ used in Table 6, referring to the respective differing formation conditions, can be found in the above Table 2.

TABLE 6

|  |  |  | Group 1 | | | | Group 2 | | |
|---|---|---|---|---|---|---|---|---|---|
|  |  | #3-0 | #3-1 | #3-2 | #3-3 | #3-4 | #3-5 | #3-6 |
| Piezo- electric Body | Fourth Layer | ◇ | ☐ | ☐ | ☐ | ■ | ■ | ■ |
|  | Third Layer | ◇ | ☐ | ☐ | ☐ | ■ | ■ | ■ |
|  | Second Layer | ◇ | ☐ | ☐ | ☐ | ■ | ■ | ■ |
|  | First Layer | ◇ | ☐ | ☐ | ☐ | ◆ | ◆ | ◆ |
| First Electrode | | ☐ | ☐ | ◇ | ◆ | ☐ | ◇ | ◆ |

Below Table 7 represents measurement results of FWHMs of each of the piezoelectric bodies of Samples #3-0, #3-1, #3-2, #3-3, #3-4, #3-5, and #3-6 and FWHMs of the corresponding first electrodes of Samples #3-0, #3-1, #3-2, #3-3, #3-4, #3-5, and #3-6.

TABLE 7

|  | #3-0 | #3-1 | #3-2 | #3-3 | #3-4 | #3-5 | #3-6 |
|---|---|---|---|---|---|---|---|
| FWHM of Piezoelectric Body | 1.543 | 1.513 | 1.489 | 1.469 | 1.491 | 1.446 | 1.434 |
| FWHM of First Electrode | 1.968 | 2.052 | 1.965 | 1.869 | 2.039 | 1.898 | 1.873 |

Figure 8:
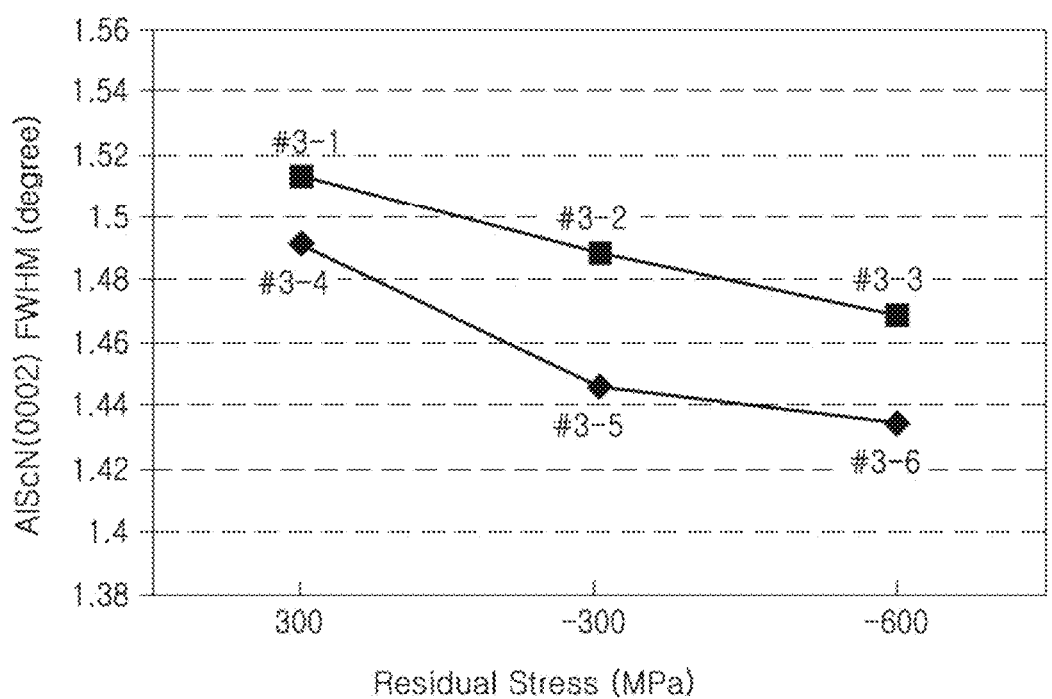
FIG. 8 illustrates graphs showing measurement results of respective FWHMs of XRD rocking curves of corresponding piezoelectric bodies for different growth conditions with the first electrode.
Figure 9:
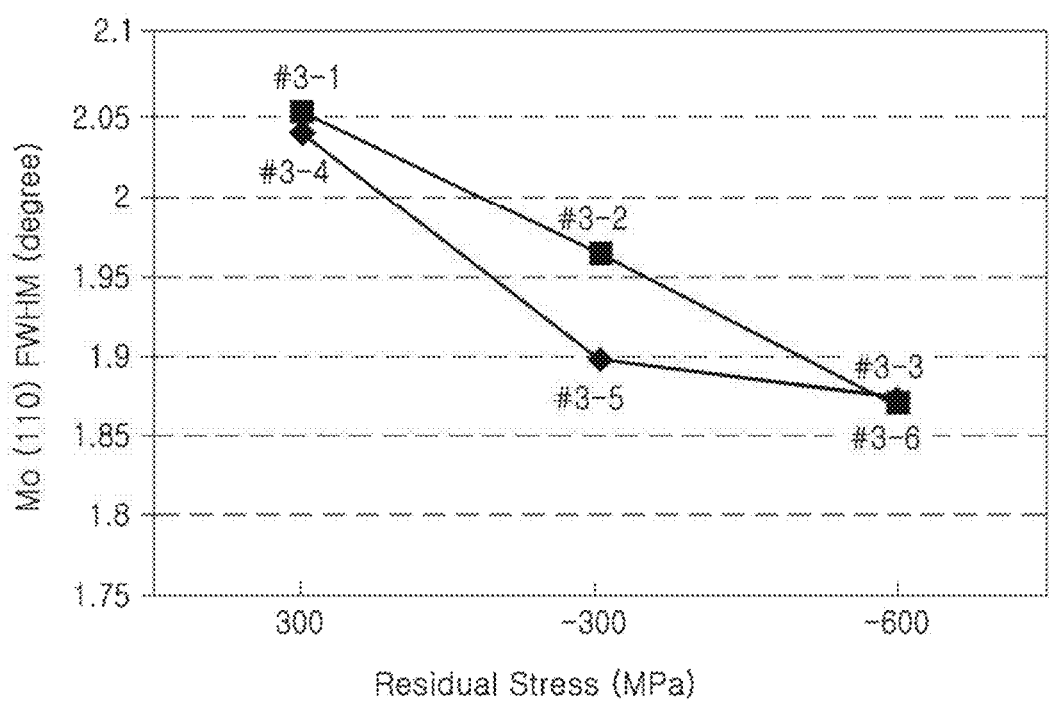
FIG. 9 illustrates graphs showing measurement results of respective FWHMs of XRD rocking curves for the first electrode for different growth conditions with the corresponding piezoelectric bodies.

FIG. 8 illustrates graphs showing measurement results of respective FWHMs of XRD rocking curves of corresponding piezoelectric bodies with different growth conditions for a first electrode; FIG. 9 illustrates graphs showing measurement results of respective FWHMs of XRD rocking curves for the first electrode for different growth conditions with the corresponding piezoelectric bodies; and FIG. 10 illustrates graphs showing respective numbers of abnormal growths of the corresponding piezoelectric bodies per unit area for different growth conditions with the first electrode.

It may be appreciated from FIGS. 8 and 9 and Table 7 that as compressive stress under which the first electrode is formed is increased, the FWHMs of the corresponding piezoelectric bodies and first electrode are decreased, such that crystal orientation is improved.

In detail, it may be appreciated that crystal orientation of a (110) face in a crystal structure of the molybdenum is improved in a case in which the first electrode is formed of the molybdenum (Mo) and crystal orientation of a (0002) face in a crystal structure of the aluminum nitride doped with the scandium is improved in a case in which the piezoelectric body is formed of the aluminum nitride doped with the scandium.

Figure 10:
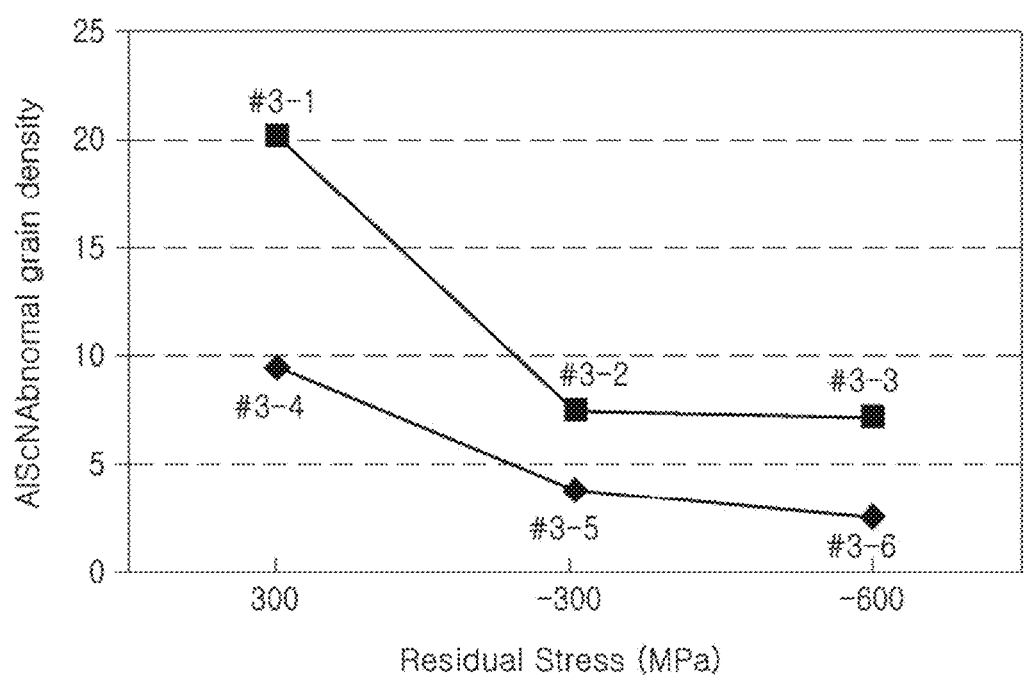
FIG. 10 illustrates graphs showing respective numbers of abnormal growths of the corresponding piezoelectric bodies per unit area for different growth conditions with the first electrode.

In addition, it may be appreciated from FIG. 10 that in both of Groups 1 and 2 of Table 6, the number of abnormal growths is decreased as compressive stress under which the first electrode is formed is increased.

That is, it may be appreciated that in the case of a first electrode that becomes a base and is densely formed before the piezoelectric body is formed, and a piezoelectric body grown on the first electrode is also formed to have high crystal orientation, a resulting number of abnormal growths in the remaining piezoelectric layers of the corresponding piezoelectric body may be decreased.

Figure 11A:
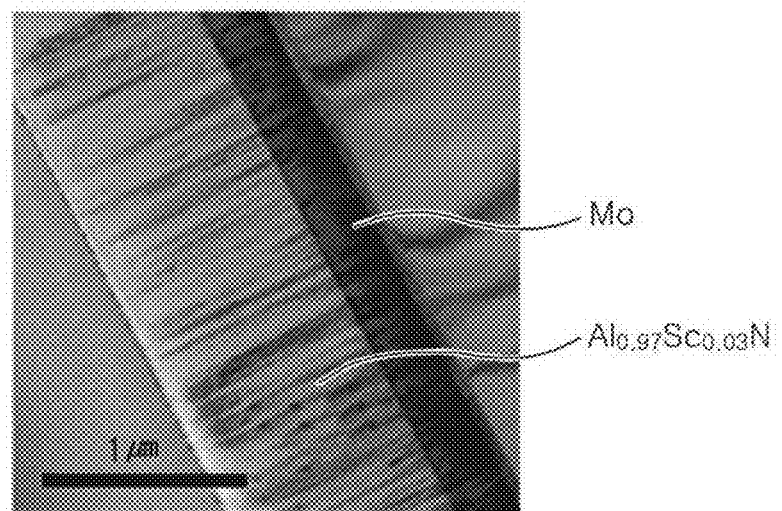
FIGS. 11A through 11C are images of a boundary between a first electrode and a piezoelectric body observed with different magnifications by a transmission electron microscope (TEM) in a case of the first electrode and the piezoelectric body having been grown under tensile stress.
Figure 11B:
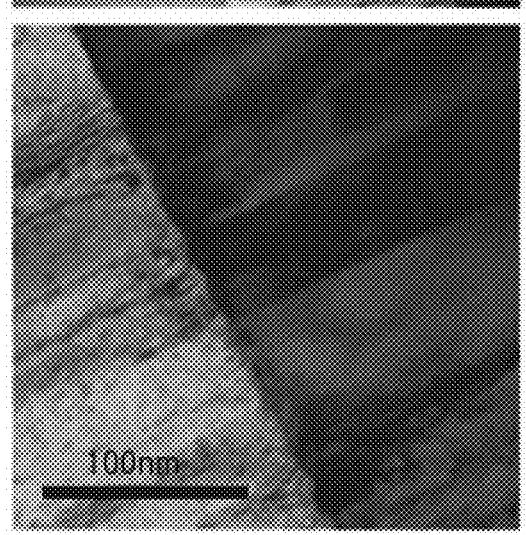
Figure 11C:
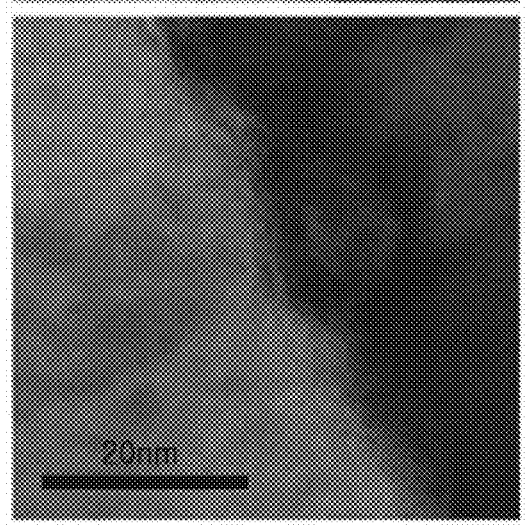
Figure 12A:
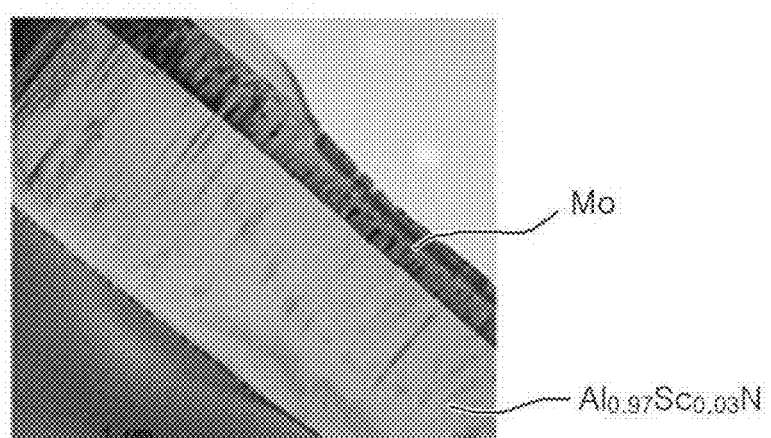
FIGS. 12A through 12C are images of a boundary between a first electrode and a piezoelectric body observed with different magnifications by the TEM in a case of the first electrode having been grown under tensile stress and a compressive piezoelectric layer in the piezoelectric body having been disposed so as to contact the first electrode.
Figure 12B:
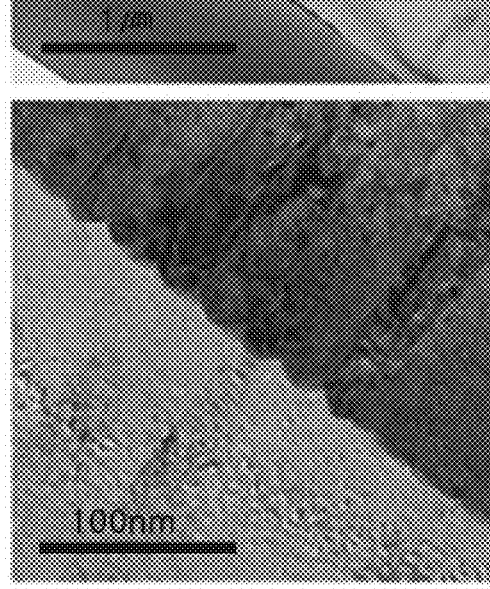
Figure 12C:
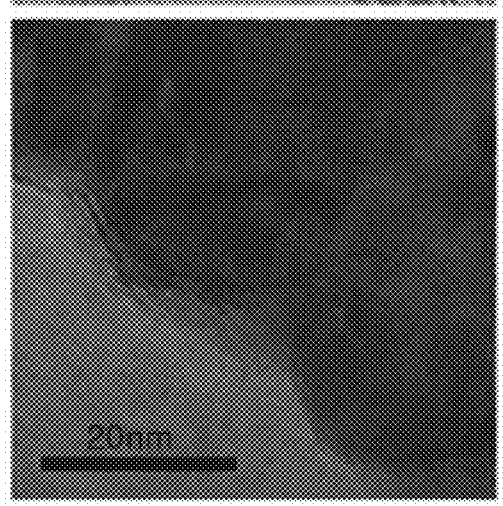

FIGS. 11A through 11C are images of a boundary between a first electrode and a piezoelectric body observed with different magnifications by a transmission electron microscope (TEM) in a case (Sample #3-1) of the first electrode and the piezoelectric body having been grown under tensile stress; FIGS. 12A through 12C are images of a boundary between a first electrode and a piezoelectric body observed with different magnifications by the TEM in a case (Sample #3-4) of the first electrode having been grown under tensile stress and a compressive piezoelectric layer in the piezoelectric body having been disposed so as to contact the first electrode; and FIGS. 13A through 13C are images of a boundary between a first electrode and a piezoelectric body observed with different magnifications by the TEM in a case (Sample #3-6) of the first electrode having been grown under compressive stress and the compressive piezoelectric layer in the piezoelectric body having been disposed so as to contact the first electrode.

The images in FIGS. 11A through 13C were obtained by imaging an interface between respective first electrodes (Mo) and respective piezoelectric bodies (ScAlN) by a high-resolution TEM.

Figure 13A:
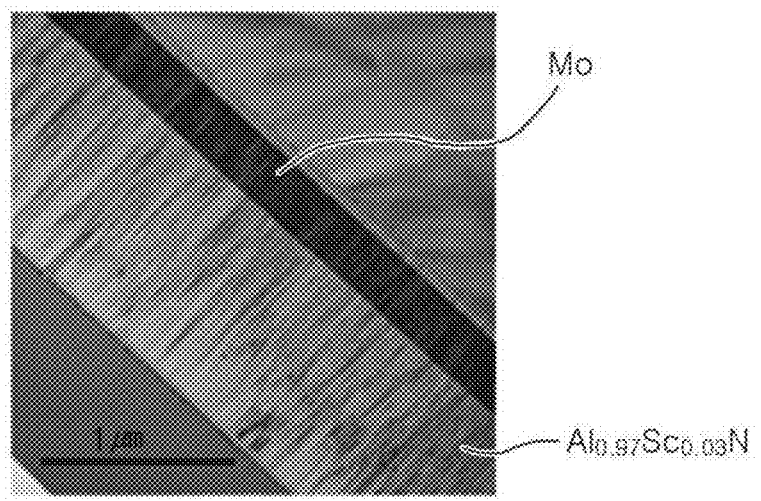
FIGS. 13A through 13C are images of a boundary between a first electrode and a piezoelectric body observed with different magnifications by the TEM in a case of the first electrode having been grown under compressive stress and the compressive piezoelectric layer in the piezoelectric body having been disposed so as to contact the first electrode.

Referring to FIGS. 11A, 12A, and 13A, the illustrated first electrodes appear as dark layers, and the adjacent piezoelectric bodies appear as a relatively thick brighter layers.

Figure 13B:
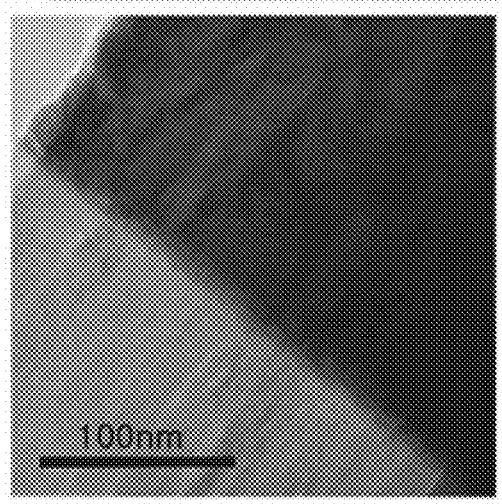
Figure 13C:
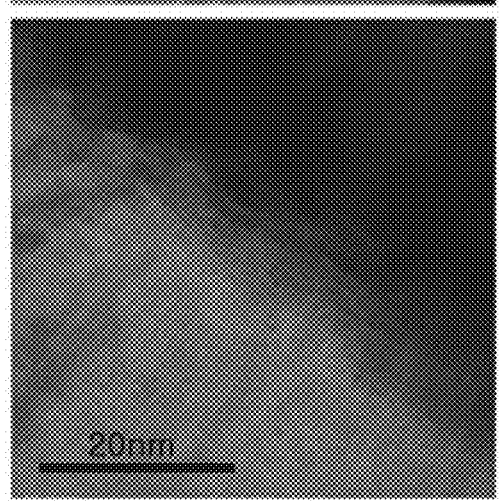

It may be appreciated that black spots appearing in the illustrated piezoelectric bodies indicate defects in the piezoelectric bodies and are significantly greater in FIG. 11B than in FIGS. 12B and 13B, and are least prominent in FIG. 13B.

In addition, it may be appreciated from FIGS. 12B and 12C that the contact boundaries between the illustrated first electrodes and illustrated piezoelectric bodies have curved shapes. In a case in which the boundary on which a first electrode and a piezoelectric body contact each other has such a curved shape, performance of the corresponding film bulk acoustic resonator may be decreased.

Unlike this, it may be appreciated from FIGS. 13B and 13C that the contact boundaries between the first electrodes and the piezoelectric bodies are substantially flat or smooth without such curve shapes.

Figure 14:
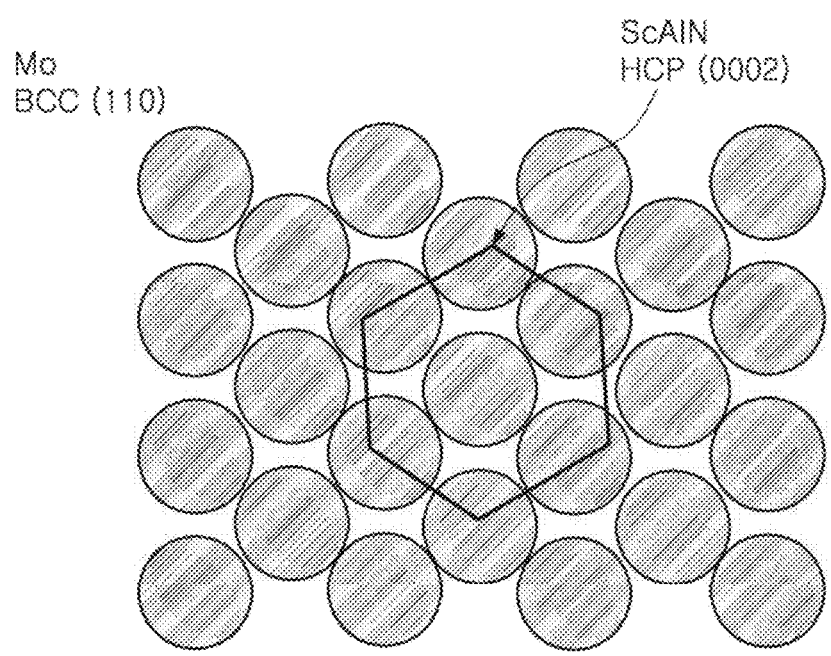
FIG. 14 is a view illustrating lattice structures of a first electrode and a piezoelectric body matched to each other according to one or more embodiments.

FIG. 14 is a view illustrating lattice structures of a first electrode and a piezoelectric body matched to each other according to one or more embodiments. A process of growing aluminum nitride doped with the scandium on a first electrode formed of the molybdenum will be described with reference to FIG. 14.

In the molybdenum, a crystal structure is a body centered cubic lattice (BCC), and a face density of a (110) face is highest.

Unlike this, in aluminum nitride doped with the scandium, a crystal structure is an HCP.

In a case of forming a piezoelectric body on the first electrode, when centers of molybdenum elements around one molybdenum element positioned at the center among molybdenum elements of the (110) face are connected to one another, a hexagon as illustrated in FIG. 14 appears.

A (0002) face of the HCP of the aluminum nitride doped with the scandium may be disposed in this hexagon.

Figure 15:
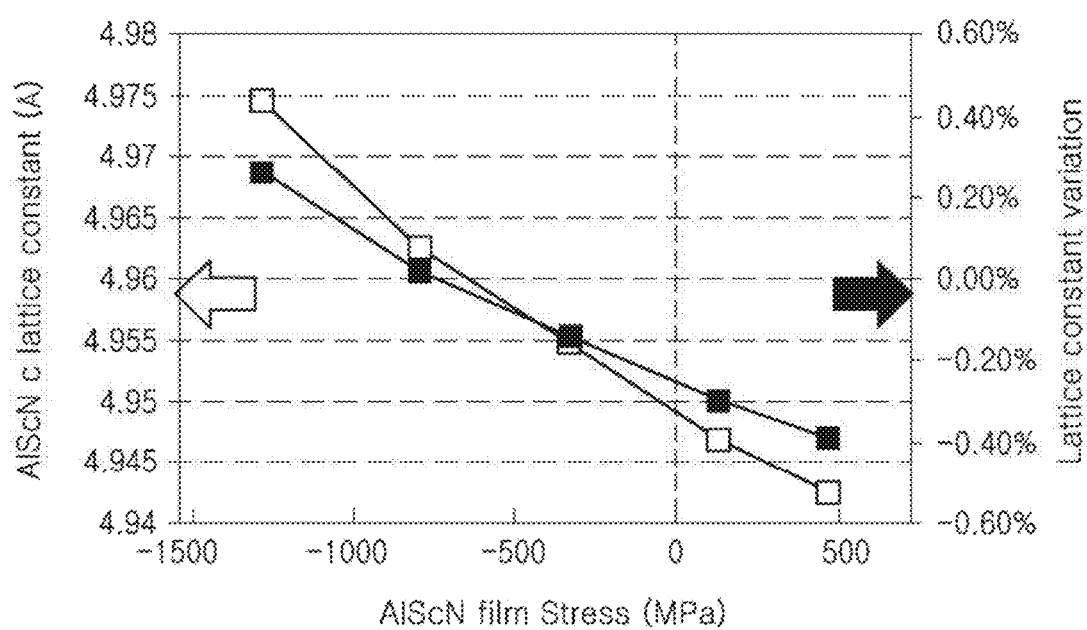
FIG. 15 illustrates two graphs respectively showing measurement results of c-axis lattice constants and lattice constant variation for different residual stresses of the piezoelectric body, measured through XRD theta-2theta scan.

FIG. 15 illustrates two graphs respectively showing measurement results of c-axis lattice constants and lattice constant variation for different residual stresses of such a piezoelectric body, measured through XRD theta-2theta scan. It may be confirmed from FIG. 15 that the c-axis lattice constant is increased when the residual stress is compressive stress and is decreased when the residual stress is tensile stress.

Figure 16:
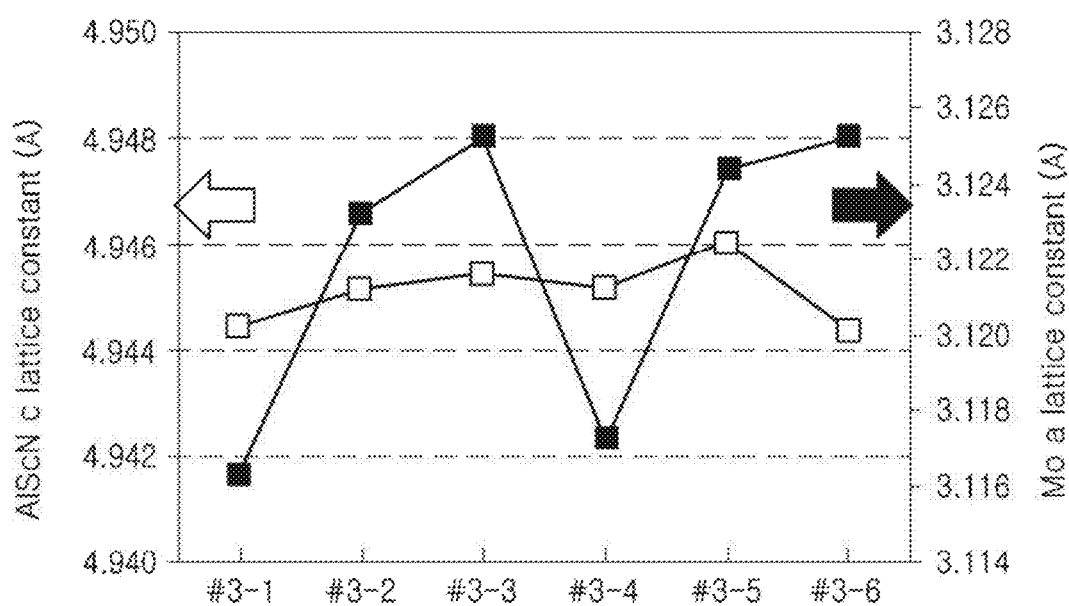
FIG. 16 illustrates two graphs respectively showing measurement results of lattice constants of a c-axis of the piezoelectric body and lattice constants of an a-axis of the first electrode, measured through XRD theta-2theta scan, for different conditions for forming the first electrode and the piezoelectric body.

FIG. 16 illustrates two graphs respectively showing measurement results of lattice constants of a c-axis of the piezoelectric body and lattice constants of an a-axis of the first electrode for different conditions for forming the first electrode and the piezoelectric body.

It may be appreciated from FIG. 16 that since the overall residual stress of the piezoelectric body is tensile stress (300 MPa), the c-axis lattice constant value of the aluminum nitride doped with the scandium appears as a constant value. However, it may be appreciated that the lattice constant of the a-axis of the first electrode is significantly increased when the residual stress is compressive stress.

That is, a lattice constant of the a-axis of the first electrode of which the residual stress is compressive stress may have a value larger than 3.12 Å.

Figure 17:
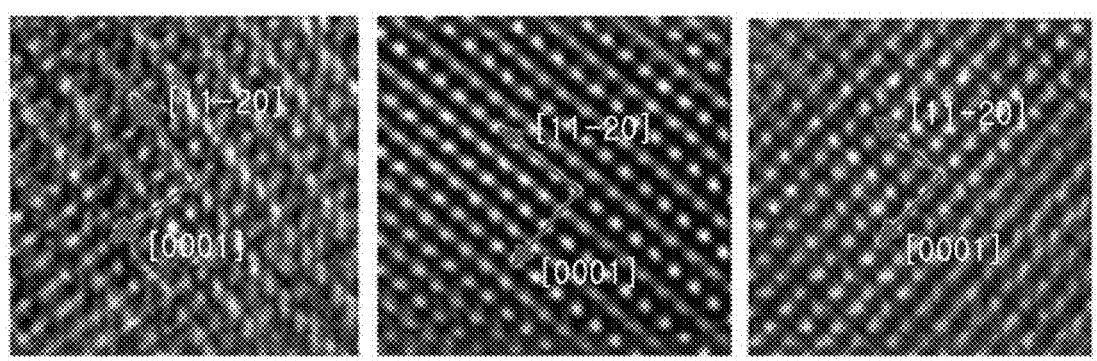
FIG. 17 illustrates three images of respective piezoelectric layers adjacent to first electrodes for three samples of Table 6, as observed using a high-resolution (HR)-TEM.

FIG. 17 illustrates three images (sequentially corresponding to Samples #3-1, #3-4, and #3-6 of Table 6) of respective ScAlN piezoelectric layers, such as each corresponding to the first piezoelectric layer 151 of FIG. 2, adjacent to first electrodes for the three samples of Table 6, as observed using a high-resolution (HR)-TEM. Since it is difficult to measure a lattice constant of the a-axis of the scandium aluminum nitride through the XRD theta-2theta scan, the lattice constants of the a-axis of the respective resultant scandium aluminum nitride layers indicated below in Table 8 were measured using the HR-TEM.

Accordingly, Table 8 demonstrates potential lattice mismatches between the first electrode and such sample piezoelectric bodies calculated by measuring lattice constants of the a-axis.

TABLE 8

| | Lattice Constant (Å) of a-Axis | | |
| --- | --- | --- | --- |
| | #3-1 | #3-4 | #3-6 |
| Piezoelectric Body (First Layer) | 2.64 | 2.64 | 2.842 |
| First Electrode | 3.139 | 3.117 | 3.125 |
| Lattice Mismatch (%) of One Side | 15.28 | 15.22 | 9.06 |
| Lattice Mismatch (%) of Six Sides | 39.283 | 38.825 | −1.902 |

It may be appreciated from FIGS. 15 through 17 and Table 8 that a potential for lattice mismatch is lowest in a case in which the first electrode is formed under compressive stress and the piezoelectric layer contacting the first electrode is a piezoelectric layer formed under compressive stress.

That is, in the case in which the first electrode is formed under compressive stress and the piezoelectric layer contacting the first electrode is the compressive piezoelectric layer formed under compressive stress, the crystal orientation of the piezoelectric body is improved, such that performance of the film bulk acoustic resonator may be improved.

Figure 18:
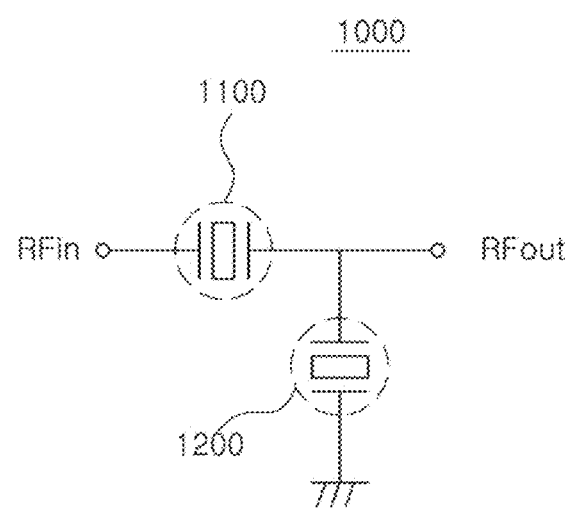
FIGS. 18 and 19 are schematic circuit diagrams of filters according to differing embodiments.
Figure 19:
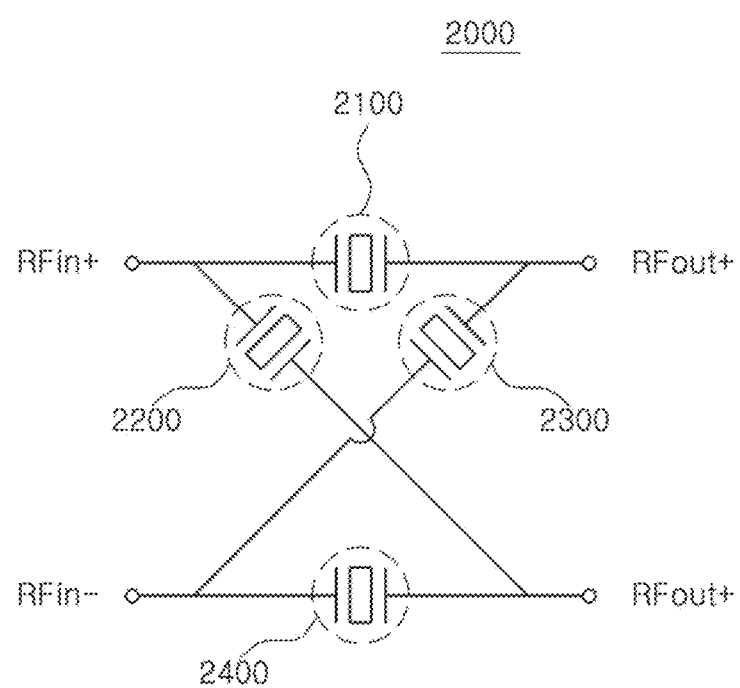

FIGS. 18 and 19 are schematic circuit diagrams of filters according to differing embodiments.

Each of a plurality of bulk acoustic resonators used in the filters of FIGS. 18 and 19 may correspond to the film bulk acoustic resonator illustrated and described with respect to FIGS. 1 and 2, for example.

Referring to FIG. 18, a filter 1000 according to one or more embodiments may be formed to have a ladder type filter structure. In detail, the filter 1000 may include a plurality of film bulk acoustic resonators 1100 and 1200.

A first film bulk acoustic resonator 1100 may be connected between a signal input terminal to which an input signal $RF_{in}$ is input and a signal output terminal from which an output signal $RF_{out}$ is output, in series, and a second film bulk acoustic resonator 1200 may be connected between the signal output terminal and a ground.

Referring to FIG. 19, a filter 2000 according to one or more embodiments may be formed in a lattice type filter structure. In detail, the filter 2000 may include a plurality of film bulk acoustic resonators 2100, 2200, 2300, and 2400, and may filter balanced input signals $RF_{in+}$ and $RF_{in-}$ and output balanced output signals $RF_{out+}$ and $RF_{out-}$.

As set forth above, in a film bulk acoustic resonator according to one or more embodiments, the piezoelectric body may include a plurality of piezoelectric layers, and at least one of the piezoelectric layers may be a compressive piezoelectric layer grown under compressive stress, such that abnormal growths of the piezoelectric body, such as aluminum nitride to which the doping material is added, may be prevented and so the resulting film bulk acoustic resonator may have a high effective electromechanical coupling coefficient.

Accordingly, one or more embodiments may provide a film bulk acoustic resonator or filter, and method, controller, and a non-transitory computer-readable storage medium storing instructions that, when executed by one or more processors, as only an example, causes performance of any or any combination of the processes described herein and formation of a resonant part having a first electrode, a multi-layer piezoelectric body, and a second electrode, and an acoustic resonator including the same, in which an effective electromechanical coupling coefficient of an included piezoelectric body may be improved and abnormal growths of the piezoelectric layer making up the piezoelectric body, and having a doping material added thereto, may be reduced, minimized, or prevented, as only examples.

The controller and sputtering apparatus in FIGS. 20-21 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated at least in FIGS. 1-3, 14, 17, and 20-21, as only examples, that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic resonator comprising:
   a substrate;
   a first electrode disposed above the substrate;
   a piezoelectric body disposed on the first electrode and including aluminum nitride with a doping material; and
   a second electrode disposed on the piezoelectric body,
   wherein the piezoelectric body comprises a first portion and a second portion, and
   the first portion is closer to the first electrode than the second portion, and
   a ratio (c/a) of a lattice parameter of the first portion in a c-axis direction to a lattice constant of the first portion in an a-axis direction is higher than a ratio (c/a) of a lattice parameter of the second portion in a c-axis direction to a lattice constant of the second portion in an a-axis direction.

2. The bulk acoustic resonator of claim 1, further comprising an air cavity between the first electrode and the substrate.

3. The bulk acoustic resonator of claim 1, wherein the doping material comprises one of scandium (Sc), erbium (Er), yttrium (Y), lanthanum (La), titanium (Ti), zirconium (Zr), and hafnium (Hf), or combinations thereof.

4. The bulk acoustic resonator of claim 1, wherein a content of the doping material in each of the plurality of piezoelectric layers is 1 atom % to 20 atom %.

5. The bulk acoustic resonator of claim 1, wherein the first portion has a c-axis lattice constant greater than a c-axis lattice constant of the second portion.

6. The bulk acoustic resonator of claim 1, wherein the first electrode comprises one selected from gold (Au), titanium (Ti), tantalum (Ta), molybdenum (Mo), ruthenium (Ru), platinum (Pt), tungsten (W), aluminum (Al), nickel (Ni), and Iridium (Ir), or alloys thereof.

7. The bulk acoustic resonator of claim 1, wherein the piezoelectric body comprises hexagonal closest packing (HCP) structures.

8. The bulk acoustic resonator of claim 1, wherein the first electrode comprises body centered cubic (BCC) structures.

9. A bulk acoustic resonator comprising:
   a substrate;
   a first electrode disposed above the substrate;
   a piezoelectric body disposed on the first electrode and including aluminum nitride with a doping material; and
   a second electrode disposed on the piezoelectric body,
   wherein a lattice constant of the first electrode in an a-axis direction is higher than 3.12 Å.

10. The bulk acoustic resonator of claim 9, wherein the first electrode comprises one selected from gold (Au), titanium (Ti), tantalum (Ta), molybdenum (Mo), ruthenium (Ru), platinum (Pt), tungsten (W), aluminum (Al), nickel (Ni), and Iridium (Ir), or alloys thereof.

11. The bulk acoustic resonator of claim 9, wherein the piezoelectric body comprises hexagonal closest packing (HCP) structures.

12. The bulk acoustic resonator of claim 9, wherein the first electrode comprises body centered cubic (BCC) structures.

13. A filter comprising:
a plurality of film bulk acoustic resonators configured as signal filter, wherein at least one of the plurality of film bulk acoustic resonators is a bulk acoustic resonator of claim 1.

14. A filter comprising:
a plurality of film bulk acoustic resonators configured as signal filter,
wherein at least one of the plurality of film bulk acoustic resonators is a bulk acoustic resonator of claim 9.

* * * * *